(12) United States Patent
Russo et al.

(10) Patent No.: US 8,637,847 B2
(45) Date of Patent: Jan. 28, 2014

(54) MEMORY CELLS HAVING A PLURALITY OF HEATERS

(75) Inventors: Ugo Russo, Monza (IT); Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 13/316,133

(22) Filed: Dec. 9, 2011

(65) Prior Publication Data
US 2013/0146833 A1 Jun. 13, 2013

(51) Int. Cl.
*H01L 29/06* (2006.01)
(52) U.S. Cl.
USPC ............. 257/5; 257/4; 257/E31.029; 438/694
(58) Field of Classification Search
USPC ........................... 257/4, 5, E32.029; 438/694
See application file for complete search history.

(56) References Cited

U.S. PATENT DOCUMENTS

| | | | |
|---|---|---|---|
| 6,984,561 B2 | 1/2006 | Herner et al. | |
| 7,485,891 B2 | 2/2009 | Hamann et al. | |
| 7,811,851 B2 | 10/2010 | Muralidhar et al. | |
| 2005/0112896 A1* | 5/2005 | Hamann et al. | 438/694 |
| 2006/0017076 A1 | 1/2006 | Lankhorst et al. | |
| 2006/0077706 A1 | 4/2006 | Li et al. | |
| 2008/0017894 A1* | 1/2008 | Happ et al. | 257/246 |
| 2009/0085024 A1* | 4/2009 | Muralidhar et al. | 257/4 |
| 2010/0110770 A1* | 5/2010 | Kim | 365/148 |
| 2010/0216279 A1 | 8/2010 | Lai et al. | |

OTHER PUBLICATIONS

Ahn, D.H. et al. "PRAM Technology: from Non Volatility to High Performances", European Symposium on Phase Change and Ovonic Science, Milan, Italy, Sep. 5-7, 2010 (5 pp.).
Jobling, Hugo. "IBM celebrates memory breakthrough", HEXUS, Jul. 4, 2011 (3 pp.).
Oh, G.H. et al. "Parallel Multi-Confined (PMC) Cell Technology for High Density MLC PRAM", 2009 Symposium on VLSI Technology Digest of Technical Papers, Kyoto, Japan, Jun. 15-18, 2009, pp. 220-221.
Qureshi, Moinuddin et al. "Morphable Memory System: A Robust Architecture for Exploiting Multi-Level Phase Change Memories", International Symposium on Computer Architecture 2010, Saint-Malo, France, Jun. 19-23, 2010 (10 pp.).
Russo, Ugo et al. "Modeling of Programming and Read Performance in Phase-Change Memories—Part I: Cell Optimization and Scaling", IEEE Transactions on Electron Devices, Feb. 2008, vol. 55, No. 2, pp. 506-514.
Andrea Silvagni, et al., "Phase Change Memory: Mainstream Ambitions"(Abstract p. cii), Forward Insights, Oct. 2010, (9 pgs.).

* cited by examiner

*Primary Examiner* — Thao Le
*Assistant Examiner* — Matthew Gordon
(74) *Attorney, Agent, or Firm* — Brooks, Cameron & Huebsch PLLC

(57) ABSTRACT

Resistive memory cells having a plurality of heaters and methods of operating and forming the same are described herein. As an example, a resistive memory cell may include a resistance variable material located between a first electrode and a second electrode, a first heater coupled to a first portion of the resistance variable material, a second heater coupled to a second portion of the resistance variable material, a third heater coupled to a third portion of resistance variable material, and a conductive material coupled to the first, second, and third heaters.

28 Claims, 7 Drawing Sheets

MEMORY CELLS HAVING A PLURALITY OF HEATERS

TECHNICAL FIELD

The present disclosure relates generally to semiconductor memory apparatuses and methods, and more particularly to memory cells having a plurality of heaters.

BACKGROUND

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance memory, among others. Types of resistive memory include phase change random access memory (PCRAM) and resistive random access memory (RRAM), for instance.

Resistive memory devices, such as PCRAM devices, can include a resistive variable material such as a phase change material, for instance, which can be programmed into different resistance states to store data. The particular data stored in a phase change memory cell can be read by sensing the cell's resistance e.g., by sensing current and/or voltage variations based on the resistance of the phase change material.

Some multi-bit phase change memory cells employ a "series resistance" approach, which can require the use of complex program-verify algorithms, for instance. Additionally, such cells may incur resistance drift, in which the resistance of anamorphous state increases over time. Resistance drift can diminish the retention capability of the cell.

DETAILED DESCRIPTION

Figure 1:
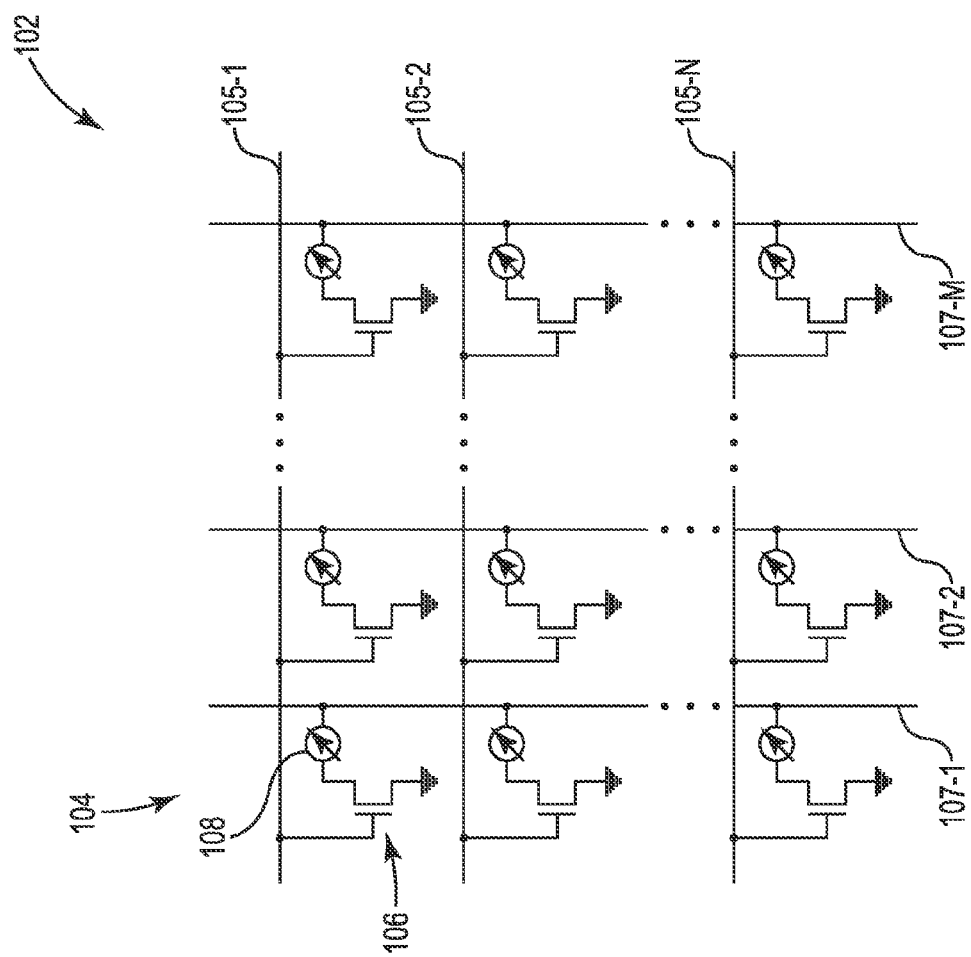
FIG. 1 is a schematic diagram of a portion of a resistive memory array in accordance with a number of embodiments of the present disclosure.

Resistive memory cells having a plurality of heaters and methods of operating and forming the same are described herein. As an example, a resistive memory cell can include a first electrode, a second electrode, and a phase change material located between the first electrode and the second electrode. The resistive memory cell also includes a plurality of heaters coupled to a respective portion of the phase change material, where each of the heaters is coupled to a conductive material.

Embodiments of the present disclosure can provide multi-bit resistive memory cells having improved programmed resistive capability as compared to previous approaches such as series resistance approaches. Embodiments of the present disclosure can also be more immune to amorphous resistance drift as compared to previous approaches. In a number of embodiments, the resistive cells are vertical multi-level cells having $4F^2$ architecture. As such, embodiments can provide improved storage density and improved scalability as compared to previous approaches, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "4" in FIG. 1, and a similar element may be referenced as 204 in FIG. 2. Also, as used herein, "a number of" a particular element and/or feature can refer to one or more of such elements and/or features.

FIG. 1 is a schematic diagram of a portion of a resistive memory array 102 in accordance with one or more embodiments of the present disclosure. The resistive memory array 102 includes a number of memory cells 104, each including a select device 106 coupled to a resistive storage element 108. The memory cells 104 can be formed in accordance with embodiments described herein.

The resistive storage elements 108 can include a resistance variable material, e.g., a phase change material. The phase change material can be a chalcogenide e.g., a Ge—Sb—Te material such as $Ge_2Sb_2Te_5$, $Ge_1Sb_2Te_4$, $Ge_1Sb_4Te_7$, etc., among other resistance variable materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

The select devices 106 may be field effect transistors, e.g. metal oxide semiconductor field effect transistors (MOSFETs), a bipolar junction transistor (BJT) or a diode, among other types of select devices. Although the select device 106 shown in FIG. 1 is a three terminal select device, the select devices can be two terminal select devices, for instance.

In the example illustrated in FIG. 1. the select device 106 is a gated three terminal field effect transistor. As shown in FIG. 1, a gate of each select device 106 is coupled to one of a number of access lines 105-1, 105-2 . . . , 105-N, i.e., each access line 105-1, 105-2, . . . , 105-N is coupled to a row of memory cells 104. The access lines 105-1, 105-2, . . . , 105-N may be referred to herein as "word lines." The designator "N"

is used to indicate that the resistive memory array 102 can include a number of access lines.

In the example illustrated in FIG. 1, each resistive storage element 108 is coupled to one of a number of data/sense lines 107-1, 107-2, . . . , 107-M, i.e., each data line 107-1, 107-2, . . . , 107-M is coupled to a column of memory cells 104. The data lines 107-1, 107-2, . . . , 107-M may be referred to herein as "bit lines." The designator "M" is used to indicate that the resistive memory array 102 can include a number of data lines. The designators M and N can have various values. For instance, M and N can be 64, 128, or 256. However, embodiments are not limited to a particular number of word lines and/or bit lines.

The select devices 106 can be operated, e.g., turned on/off, to select/deselect the memory cells 104 in order to perform operations such as data programming, e.g., writing, and/or data reading operations. In operation, appropriate voltage and/or current signals, e.g., pulses, can be applied to the bit lines and word lines in order to program data to and/or read data from the memory cells 104. As an example, the data stored by a memory cell 104 of array 102 can be determined by turning on a select device 106, and sensing a current through the resistive storage element 108. The current sensed on the bit line corresponding to the memory cell 104 being read corresponds to a resistance level of the resistance variable material of resistive storage element 108, which in turn may correspond to a particular data state, e.g., a binary value. The resistive memory array 102 can have an architecture other than that illustrated in FIG. 1, as will be understood by one of ordinary skill in the art.

In a number of embodiments of the present disclosure, the resistive memory array 102 can have a $4F^2$ architecture, e.g. the resistive memory cells 104 of the resistive memory array 102 can have a $4F^2$ footprint. Also, the resistive memory cells 104 may be vertical memory cells as described further herein.

Figure 2A:
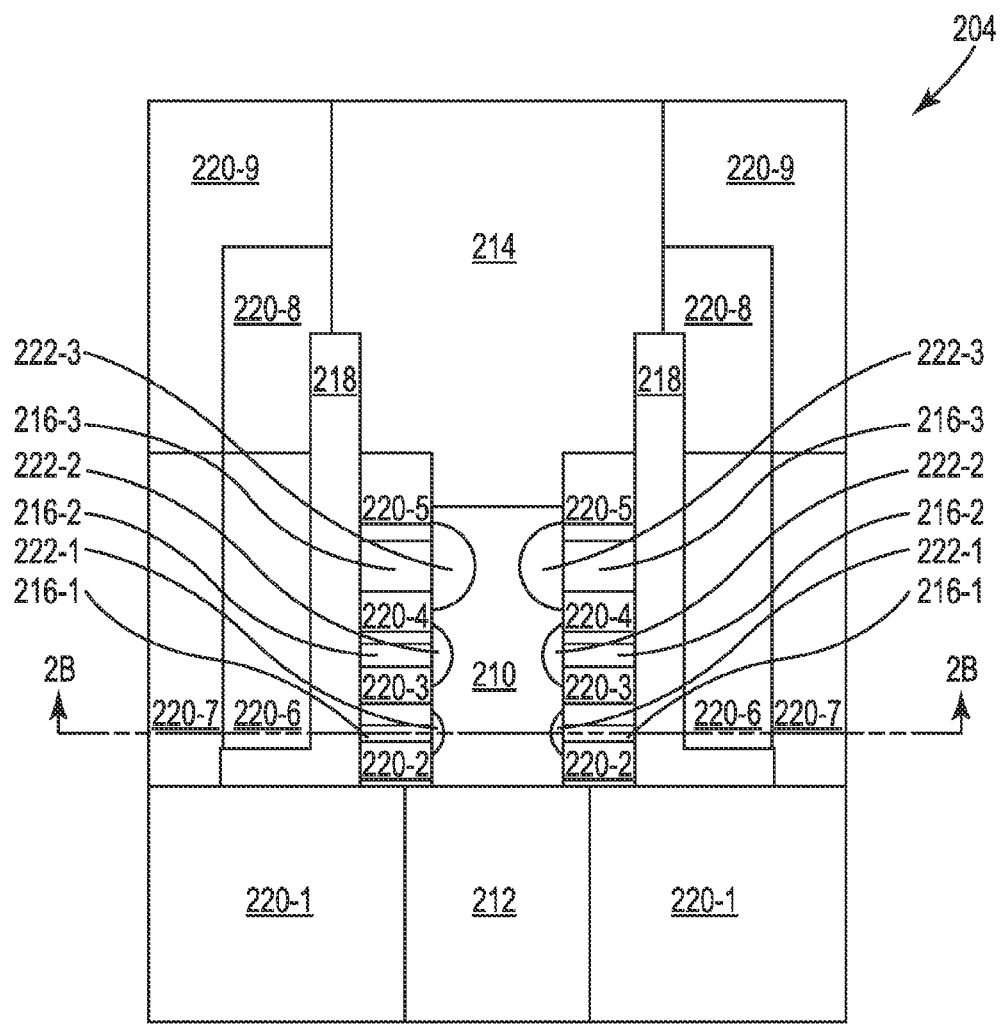
FIGS. 2A-2B illustrate cross-sectional views of a portion of a resistive memory cell in accordance a number of embodiments of the present disclosure.
Figure 2B:
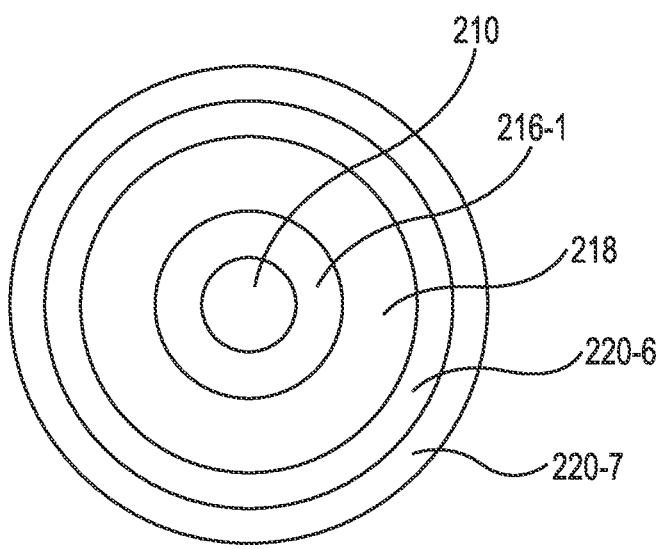

FIGS. 2A-2B illustrate cross-sectional views of a portion of a resistive memory cell 204 in accordance a number of embodiments of the present disclosure. The resistive memory cell 204 includes a resistance variable material 210 located between a first electrode 212 and a second electrode 214. The resistance variable material 210 can be a phase change material such as those described above, for instance. That is, the memory cell 204 can be a phase change memory cell. The first and second electrodes 212 and 214 can be conductive materials, e.g., metals, such as titanium nitride, tantalum nitride, platinum, copper, tungsten, tungsten nitride, and/or ruthenium, among other conductive materials and/or combinations thereof. As an example, the electrode 214 can be, or can be coupled to, a line such as lines 107-1 to 107-M shown in FIG. 1, and the electrode 212 can be coupled to a select device corresponding to cell 204, e.g., a select device such as select device 106 shown in FIG. 1.

In a number of embodiments, and as shown in FIG. 2A, the memory cell 204 can include a plurality of heaters 216-1, 216-2, and 216-3. The heaters 216-1, 216-2, and 216-3 each have a respective contact area with the resistance variable material 210 and are electrically coupled to one of the electrodes 212 and 214, e.g., to electrode 214 in the example shown in FIG. 2A, via a conductive material 218, which can be referred to as a conductive contact 218.

FIG. 2B is cross-sectional view of FIG. 2A taken along cut line 2B-213 of FIG. 2A. As illustrated in FIG. 2B, the conductive material 218 surrounds the resistance variable material 210, e.g., a portion of the resistance variable material 218 in contact with the heater 210-1. Other cross-sections, e.g., those including heater 210-2 and heater 210-3, of the cell 202 may have material relationships like those illustrated in FIG. 2B. As such, in accordance with a number of embodiments of the present disclosure, the conductive material 218 can also surround different respective portions of the resistance variable material 210 that contact the heaters 210-2 and 210-3.

As shown in FIG. 213, the conductive contact 218 and heaters 216-1, 216-2, and 216-3 can be annular, e.g., ring-shaped. The conductive contact 218 and heaters 216-1, 216-2, and 216-3 can be formed of various conductive materials such as titanium, titanium nitride, silicon carbide, graphite, tantalum nitride, tantalum-aluminum nitride, tungsten nitride, aluminum oxide and tantalum oxide, for instance, and/or combinations thereof. Also, the memory cells can include a dielectric material, e.g., 220, as described further herein.

In a number of embodiments, the contact areas between the resistance variable material 210 and the respective heaters 216-1, 216-2, and 216-3 are different. For instance, a thickness of heater 216-1 is less than a thickness of heater 216-2, which has a thickness less than that of heater 216-3. As such, the contact area between material 210 and heater 216-3 is greater than the contact area between material 210 and heater 216-2, and the contact area between material 210 and heater 216-2 is greater than the contact area between material 210 and heater 216-1. However, the different contact areas between the resistance variable material 210 and the respective heaters 216-1, 216-2, and 216-3 may have various arrangements.

The example shown in FIG. 2A illustrates a number of active regions, 222-1, 222-2, and 220-3 associated with the respective heaters 216-1, 216-2, and 216-3. The active regions 222-1, 222-2, and 220-3 can represent portions of the resistance variable material 210 which undergo phase transitions, e.g., from crystalline (low resistance) to amorphous (high resistance) and vice versa, in response to heating due to current flow between the electrodes 212 and 214 during memory cell operations. The resistance associated with the resistance variable material 210 depends on the phase of the respective active regions 222-1, 222-2, and 220-3. For instance, a lowermost resistance associated with material 210 can correspond to each of the active regions 222-1, 222-2, and 220-3 being in a crystalline phase. An uppermost resistance associated with material 210 can correspond to each of the active regions 222-1, 222-2, and 220-3 being in an amorphous phase. A first intermediate resistance associated with material 210 can correspond to one of the active regions, e.g., 222-3, being in an amorphous phase, and a second intermediate resistance associated with material 210 can correspond to two of the active regions, e.g.,222-2 and 222-3, being in an amorphous phase. The different resistances associated with material 210 can correspond to different data states of cell 204, which can be represented by particular data values, e.g., binary data values, stored by cell 204. For instance, the lowermost resistance can correspond to a data state represented by "11", the uppermost resistance can correspond to a data state represented by "00", and the intermediate resistances can correspond to data states represented by "10" and "01", respectively. Embodiments are not limited to these particular data assignments.

Due to the different contact areas between the resistance variable material 210 and the respective heaters 216-1, 216-2, and 216-3, the corresponding active regions 222-1, 222-2, and 222-3 may transition from a crystalline phase to an amorphous phase, for instance, responsive to different applied programming voltages, e.g., different voltage differences between electrodes 212 and 214. For instance, active regions associated with heaters having a greater corresponding contact area between the particular heater and the material 210 may transition to an amorphous phase responsive to a relatively lower applied programming voltage than active regions associated with heaters having a lesser corresponding contact area between the particular heater and the material 210.

As such, a programming voltage can be determined which is sufficient to effect transition of active region 222-3 from a crystalline phase to an amorphous phase but which is insufficient to effect transition of active regions 222-1 and 222-2 to the amorphous phase. Similarly, a programming voltage can be determined which is sufficient to effect transition of active regions 222-3 and 222-2 from a crystalline phase to an amorphous phase but which is insufficient to effect transition of active region 222-1 to the amorphous phase. Also, a programming voltage can be determined which is sufficient to effect transition of each of active regions 222-1, 222-2, and 222-3 from a crystalline phase to an amorphous phase. Additionally, a programming voltage can be determined which is insufficient to effect transition of active regions 222-1, 222-2, and 222-3 from a crystalline phase. The different programming voltages can be applied to cell 204 in order to program the cell 204 to one of a number of target data states, e.g., four data states (11, 10, 01, and 00) in this example.

Although the embodiment described in FIGS. 2A and 2B illustrates a 2-bit memory cell 204, e.g., a cell programmable to four data states, embodiments are not so limited. For instance, the memory cell 204 can include more (or less) than three heaters 216-1, 216-2, and 216-3. That is, the cell 204 can include additional heaters vertically spaced apart and having different contact areas between the resistance variable material 210. For instance, cell 204 could include seven heaters such that the cell is programmable to eight different data states, e.g., a 3-bit cell. As such, the storage density of the cell 204 can be increased while maintaining a 4F$^2$ footprint, for example.

Embodiments of the present disclosure are not limited to the physical structure of cell 204 shown in FIGS. 2A and 2B. For instance, in a number of embodiments, the structures of the electrodes 212/214 can be different. Also, the contact locations of the electrodes 212/214 can be different, as well as a contact area between the respective electrodes 212/214 and the resistance variable material 210 and/or conductive material 218. For instance, in a number of embodiments, a dielectric material can be located between electrode 214 and material 210 such that the electrode 214 is not in direct contact with the material 210, which may provide enhanced current flow through the heaters 216-1, 216-2, and 216-3, e.g., as compared to the example shown in FIG. 2A.

In a number of embodiments, the electrode 212 may be in direct contact with the conductive contact 218, e.g., as opposed to the electrode 214 being in direct contact with the conductive contact 218. In such embodiments, the electrode 214 can be in direct contact with the resistance variable material 210 and can be separated from the conductive contact 218 by a dielectric material. In such embodiments, the electrode 212 may or may not be in direct contact with the material 210. For instance, a width of electrode 212 can be such that it contacts both the material 210 and the conductive contact 218. Also, the electrode 212 can be non-aligned with cell 204 such that it contacts can be larger than the conductive contact 218, e.g., such that it contacts only one side of conductive contact 218. In a number of embodiments, an additional conductive material, e.g., a metal layer, can be formed between the conductive contact 218 and the electrode 212 such that the electrode 212 does not directly contact the material 210 or the contact 218.

FIGS. 3A-3D illustrate various process stages associated with forming a resistive memory cell in accordance with a number of embodiments of the present disclosure, e.g., a cell such as cell 104 or 204 described above in discussing FIGS. 1 and 2, respectively. The resistive memory cell can be formed using various processing techniques such as atomic material deposition (ALD), physical vapor deposition (PVD), chemical vapor deposition (CVD), supercritical fluid deposition (SFD), or other suitable processes. In accordance with a number of embodiments of the present disclosure, a method of forming a resistive memory cell can include forming a first electrode material 312. The first electrode material 312 may be an electrode material such as copper, platinum, tungsten, and/or silver, among various other materials and/or combinations thereof. The first electrode material 312 may be formed, e.g., patterned, on a dielectric material 320-1. In accordance with a number of embodiments of the present disclosure, dielectric materials 320 can be a silicon oxide or silicon nitride, for instance.

A material stack 324 can be formed on the electrode material 312. The material stack 324 can include a number of alternating conductive and dielectric materials. The material stack 324 shown in FIG. 3A includes a plurality of conductive materials 316-1, 316-2, 316-3, separated by respective dielectric materials 320-3, 320-4. In this example, a dielectric material 320-2 is formed on electrode 312 and a dielectric material 320-5 is formed on material 316-3. Portions of the dielectric materials 320-3, 320-4, and 320-5 are illustrated in FIG. 2A, e.g., as 220-3, 220-4, and 220-5, respectively. The plurality of heater materials 316-1, 316-2, 316-3 may be parallel to each other.

In accordance with a number of embodiments of the present disclosure, each of the plurality of heater materials 316-1, 316-2, 316-3 has a different thickness. For example, heater material 316-1 has a thickness 326-1, heater material 316-2 has a thickness 326-2, and heater material 316-3 has a thickness 326-3. In this example, thickness 326-2 is greater than thickness 326-1 and thickness 326-3 is greater than thickness 326-2. As an example, each of the plurality of heater materials 316-1, 316-2, 316-3 may include titanium, titanium nitride, silicon carbide, graphite, tantalum nitride, tantalum-aluminum nitride, tungsten nitride, aluminum oxide, and tantalum oxide among various other materials and/or combinations thereof.

Figure 3A:
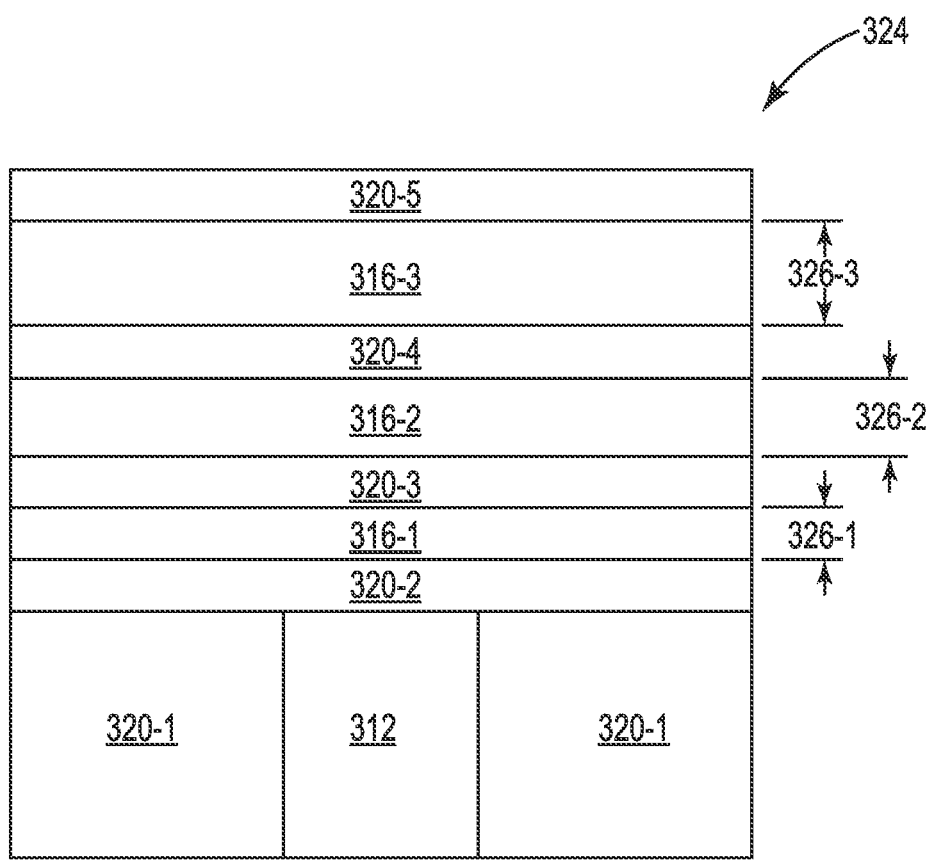
FIGS. 3A-3D illustrate various process stages associated with forming a resistive memory cell in accordance with a number of embodiments of the present disclosure
Figure 3B:
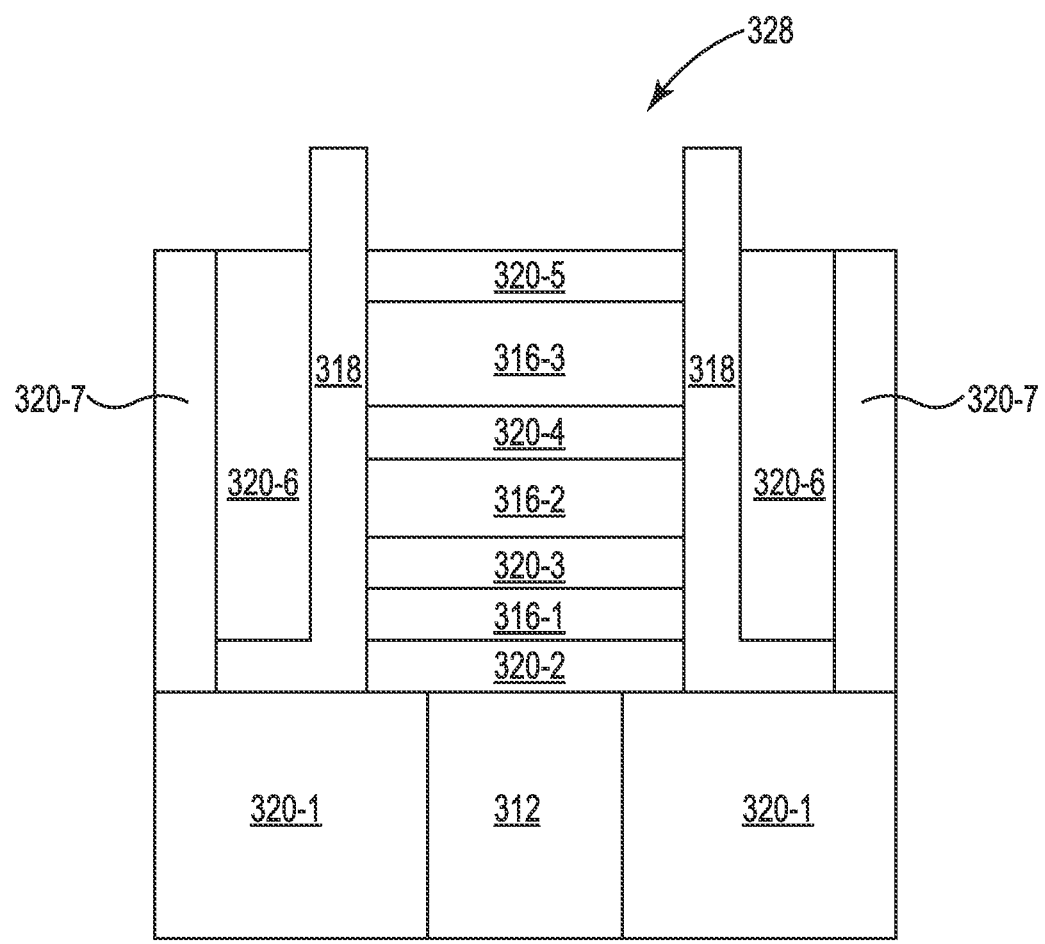

FIG. 3B illustrates material stack 324 of FIG. 3A at a subsequent processing stage. In FIG. 3B portions of material stack 324 have been removed, e.g., patterned and etched, to form a heater stack 328. A conductive material 318 can be formed, e.g., conformally, on heater stack 328 such that it contacts each of the plurality of heater materials 316-1, 316-2, 316-3. In this example, the conductive material 318 does not contact the first electrode material 312; however, embodiments are not so limited. The conductive material 318 can include copper, platinum, tungsten, and/or silver among various other materials and/or combinations thereof.

A dielectric spacer material 320-6 can be formed on the conductive material 318. Portions of the dielectric spacer material 320-6 and/or the conductive material 318 can be selectively removed, e.g., etched, in order to form the "L" shaped cross-section of conductive contact 318. A dielectric material 320-7 can be subsequently formed on the structure shown in FIG. 3B in a filling process, and then an upper surface of the structure can be planarized, e.g., via CMP. A subsequent etch can be performed to selectively remove portions of the dielectric materials 320-6 and 320-7 to faun the structure illustrated in FIG. 3B. Portions of the dielectric materials 320-6 and 320-7 are illustrated in FIG. 2A, e.g., as 220-6 and 220-7, respectively.

Figure 3C:
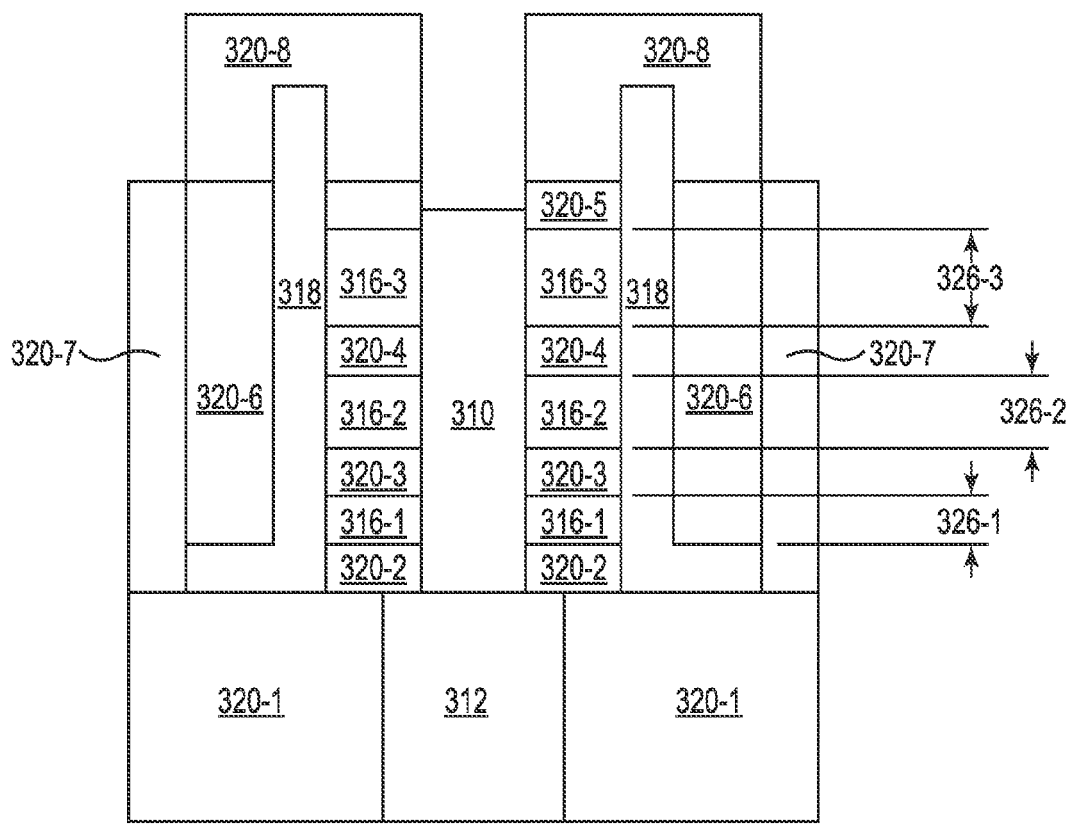

FIG. 3C illustrates the structure shown in FIG. 3B at a subsequent processing stage. As an example, a dielectric material 320-8 can be formed, e.g., conformally, on the structure shown in FIG. 3B. Portions of the dielectric material 320-8 are illustrated in FIG. 2A, e.g., as 220-8. Portions of the dielectric material 320-8 and a middle portion of heater stack 328 can be removed, e.g., by etching. For instance, the heater stack 328 can be etched down to electrode 312. The etching of the heater stack 328 can form a hole in the stack 328 in which a resistance variable material 310 can be formed, e.g., deposited. An etch back process, for instance, can be used to remove a portion of material 310 from the hole, e.g., such that the material 310 is formed to a desired depth. As shown in FIG. 3C, heater material 316-1 contacts a first portion of material 310, heater material 316-2 contacts a second portion material 310, and heater material 316-3 contacts a third portion of material 310. As described above in connection with FIG. 3A, since the plurality of heater materials 316-1, 316-2, 316-3 have different respective thicknesses 326-1, 326-2, 326-3, each of the plurality of heater materials 316-1, 316-2, 316-3 has a different respective contact area with the resistance variable material 310. In this example, an area of contact between heater 316-1 and the first portion of the resistance variable material 310 is less than an area of contact between heater 316-2 and the second portion of the resistance variable material 310, and, the area of contact between heater 316-2 and the portion of the resistance variable material 320 is less than an area of contact between heater 316-3 and the third portion of the resistance variable material 310.

In accordance a number of embodiments of the present disclosure, a contact area, i.e., the area of contact between the resistance variable material 310 and each of the plurality of heaters 316-1, 316-2, 316-3 may be a tuning parameter for each of the plurality of heaters 316-1, 316-2, 316-3. For instance, the thicknesses 326-1, 326-2, 326-3 of the plurality of heaters 316-1, 316-2, 316-3 can be tuned to achieve different contact areas between the resistance variable material 310 and the respective heaters 316-1, 316-2, 316-3. As described above, in connection with FIG. 2A, different contact areas between the heaters 316-1, 316-2, 316-3 and the resistance variable material 310 can lead to different programming voltages necessary to induce a phase change of active regions, e.g., 222-1, 222-2, and 222-3 shown in FIG. 2A.

In the example shown in FIG. 3C, the resistance variable material 310 contacts the electrode 312. However, embodiments are not so limited. For example, the resistance variable material 310 may be separated from the electrode 312 by a conductive material (not shown in FIG. 3C). Additionally, the resistance variable material 310 may be offset from the electrode 312 such that the resistance variable material 310 and the electrode 312 do not contact one another.

Figure 3D:
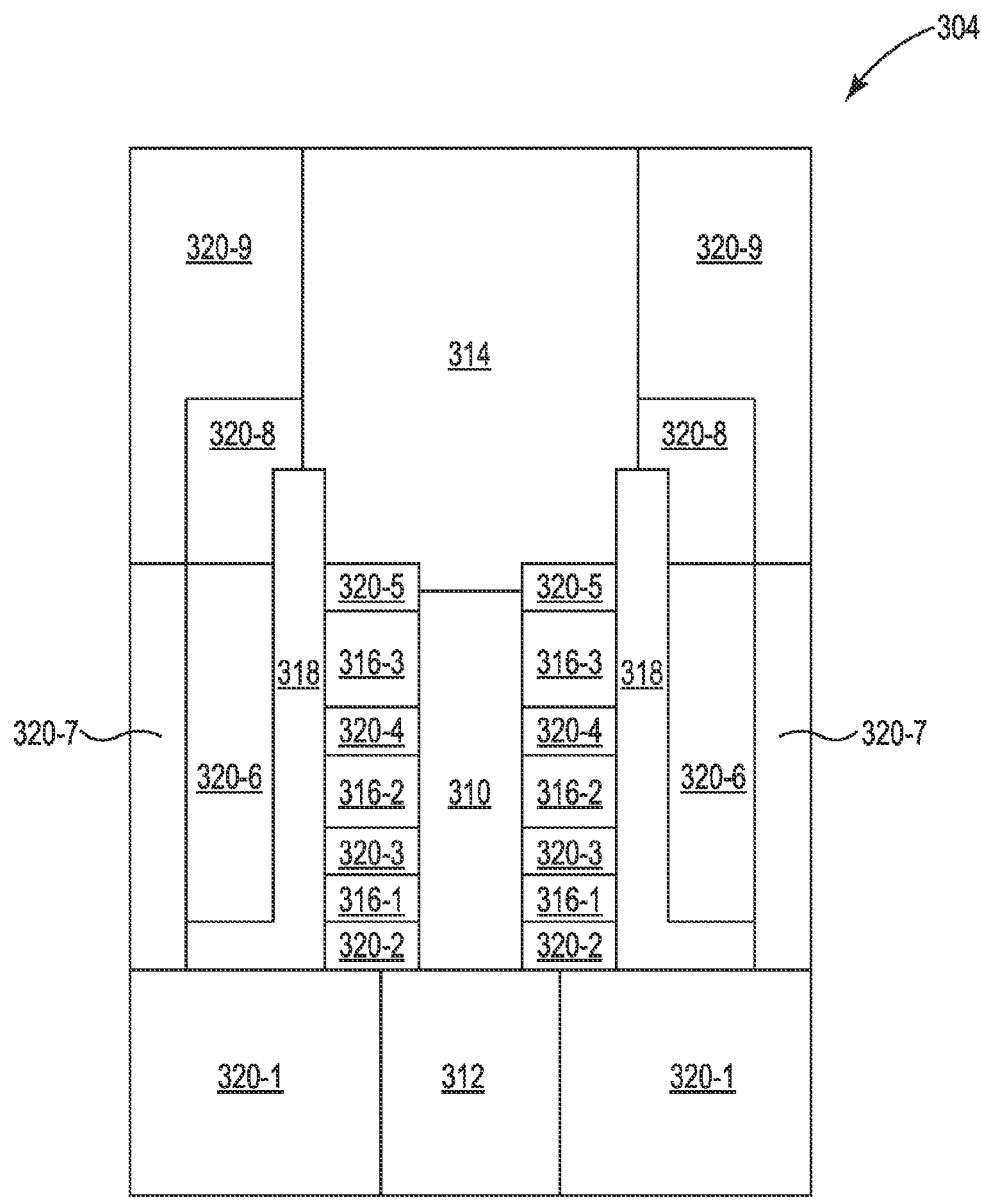

FIG. 3D illustrates the structure of FIG. 3C at a subsequent processing stage. FIG. 3D illustrates an electrode 314 contacting the conductive material 318. Forming the electrode 314 can include forming a dielectric material 320-9 on the structure shown in FIG. 3C and then patterning and etching the material 320-9 to form a location form deposition of electrode material 314. Portions of the dielectric material 320-9 are illustrated in FIG. 2A, e.g., as 220-9.

Although the electrode 314 is shown in contact with the conductive material 318, embodiments are not so limited. For example, the electrode material 312 may contact the conductive material 318; e.g., instead of electrode 314. In such examples, the electrode 314 may be separated form the conductive material 318 by a dielectric material. In accordance with a number of embodiments of the present disclosure, the conductive material 318 can create a number of conductive pathways between the first and second electrodes 312, 314 and through the resistance variable material 310 via the first, second, and third heaters 316-1, 316-2, 316-3.

In accordance with a number of embodiments of the present disclosure at least one of the first and second electrodes 312,314 contacts the resistance variable material 310, e.g. a forth portion and/or a fifth portion of the resistance variable material 310. An area of contact between electrode 312 and/or electrode 314 and the resistance variable material 310 can be greater than area of contact between each respective heater 316-1, 316-2, and 316-3 and the resistance variable material 310, e.g., such that areas of the resistance variable material 318 contacting electrode 312 and/or electrode 314 do not transition from the crystalline phase to the amorphous phase.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore. the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A resistive memory cell, comprising:
    a resistance variable material located between a first electrode and a second electrode;
    a first heater coupled to a first portion of the resistance variable material;
    a second heater coupled to a second portion of the resistance variable material;
    a third heater coupled to a third portion of the resistance variable material; and
    a conductive material coupled to the first, second, and third heaters, wherein the conductive material has an annular configuration about the first, second, and third heaters.

2. The memory cell of claim 1, wherein an area of contact between the first heater and the first portion of the resistance variable material is less than an area of contact between the second heater and the second portion of the resistance variable material.

3. The memory cell of claim 2, wherein the area of contact between the second heater and the second portion of the resistance variable material is less than an area of contact between the third heater and the third portion of the resistance variable material.

4. The memory cell of claim 1, wherein the first, second, and third heaters are spaced apart vertically.

5. The memory cell of claim 1, wherein one of the first and second electrodes is coupled to a fourth portion of the resistance variable material.

6. The memory cell of claim 1, wherein the conductive material creates a number of conductive pathways between the first and second electrodes and through the resistance variable material via the first, second, and third heaters.

7. The memory cell of claim 1, wherein the resistance variable material is a phase change material.

8. A memory cell, comprising:
 a resistance variable material located between a first electrode and a second electrode; and
 a plurality of heaters vertically separated from each other, wherein each of the plurality of heaters is in contact with a different respective portion of the resistance variable material and is coupled to a conductive material and the conductive material has an annular configuration about the plurality of heaters.

9. The memory cell of claim 8, wherein the memory cell is a vertical cell.

10. The memory cell of claim 8, wherein each of the plurality of heaters has a different respective thickness.

11. The memory cell of claim 8, wherein the conductive material contacts only one of the first and second electrodes.

12. The memory cell of claim 8, wherein the conductive material surrounds the different respective portions of the resistance variable material in contact with the plurality of heaters.

13. The memory cell of claim 8, wherein the memory cell is a multi-bit cell.

14. The memory cell of claim 8, including a select device coupled to one of the first and second electrodes.

15. A resistive memory array, comprising:
 a number of resistive storage elements; and
 a select device coupled to each of the respective number of resistive storage elements;
 wherein each of the resistive storage elements includes:
  a resistance variable material located between a first and a second electrode;
  a plurality of heaters that are each coupled to a different respective portion of the resistance variable material; and
  a conductive material coupled to each of the plurality of heaters and surrounding the different respective portions of the resistance variable material, wherein the conductive material has an annular configuration about the plurality of heaters.

16. The array of claim 15, wherein each of the plurality of heaters of a particular resistive storage element is configured to create a different respective amorphous portion in the resistance variable material via application of a respective voltage.

17. The array of claim 15, wherein the array has 4F² architecture.

18. The array of claim 15, wherein the plurality of heaters is vertical.

19. A method of forming a resistive memory cell, the method comprising:
 forming a resistance variable material between a first and second electrode material;
 forming a conductive material that surrounds at least a portion of the resistance variable material; and
 forming a plurality of heaters, wherein each of the plurality of heaters contacts a different respective portion of the resistance variable material and the conductive material and the conductive material has an annular configuration about the plurality of heaters.

20. The method of claim 19, wherein forming the plurality of heaters includes vertically separating each of the plurality of heaters from each other.

21. The method of claim 19, wherein forming the plurality of heaters includes providing a different respective thickness for each of the plurality of heaters.

22. A method of forming a resistive memory cell, the method comprising:
 forming a first electrode material;
 forming a material stack on a portion of the first electrode material, wherein the material stack includes a plurality of heater materials having different thicknesses and separated by respective dielectric materials;
 removing portions of the material stack to form a heater stack;
 forming a conductive material such that it surrounds at least a portion of the heater stack and contacts each of the plurality of heater materials and the conductive material has an annular configuration about the plurality of heater materials;
 removing a portion of the heater stack including a portion of each of the plurality of heater materials; and
 forming a resistance variable material in the removed portion such that the resistance variable material contacts each of the plurality of heater materials; and
 forming a second electrode material on the resistance variable material.

23. The method of claim 22, wherein forming the conductive material includes surrounding at least a portion of the resistance variable material with the conductive material.

24. The method of claim 22, including forming the conductive material such that it contacts the first electrode.

25. The method of claim 22, including forming the second electrode material such that it contacts the conductive material.

26. A method of forming a resistive memory cell, the method comprising:
 forming a first electrode material;
 forming a material stack on at least a portion of the first electrode material, wherein the material stack includes a plurality of heater materials having different thicknesses and separated by respective dielectric materials;
 removing portions of the material stack to form a heater stack;
 forming a conductive material such that it surrounds at least a portion of the heater stack and contacts each of the plurality of heater materials and the conductive material has an annular configuration about the plurality of heater materials;
 removing a portion of the heater stack including a portion of each of the plurality of heater materials; and
 forming a resistance variable material in the removed portion such that the resistance variable material contacts each of the plurality of heater materials;
 forming a dielectric material on the resistance variable material; and
 forming a second electrode material on the dielectric material.

27. The method of claim 26, including forming the second electrode material such that it contacts the conductive material.

28. The method of claim 26, including forming the resistance variable material such that it contacts the first electrode material.

* * * * *